(12) United States Patent
Mathews et al.

(10) Patent No.: US 6,800,933 B1
(45) Date of Patent: Oct. 5, 2004

(54) INTEGRATED CIRCUIT COOLING DEVICE

(75) Inventors: Charles R. Mathews, Austin, TX (US);
Miguel Santana, Jr., Buda, TX (US);
Alfredo Herrera, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 167 days.

(21) Appl. No.: 09/840,019

(22) Filed: Apr. 23, 2001

(51) Int. Cl.$^7$ ............................................. H01L 23/34
(52) U.S. Cl. ........................ 257/712; 257/93; 257/467; 257/470; 257/930
(58) Field of Search ............................ 257/712, 930, 257/93, 467, 470, 666

(56) References Cited

U.S. PATENT DOCUMENTS

| | | | |
|---|---|---|---|
| 5,637,921 A | 6/1997 | Burward-Hoy | 257/712 |
| 6,082,115 A | 7/2000 | Strnad | 62/3.7 |
| 6,154,366 A * | 11/2000 | Ma et al. | 361/704 |
| 6,173,576 B1 | 1/2001 | Ishida et al. | 62/3.7 |
| 6,196,002 B1 | 3/2001 | Newman et al. | 62/3.7 |
| 6,281,120 B1 * | 8/2001 | Strnad | 438/660 |
| 6,410,840 B1 * | 6/2002 | Sudo et al. | 136/201 |
| 6,429,137 B1 * | 8/2002 | Ghoshal | 438/706 |
| 6,476,483 B1 * | 11/2002 | Adler et al. | 257/713 |
| 6,485,191 B1 * | 11/2002 | Sato | 385/73 |
| 6,559,538 B1 * | 5/2003 | Pomerene et al. | 257/712 |

OTHER PUBLICATIONS

Victor Rudometov et al.; *Peltier coolers* (http://www.dig-it-life.com/articles/peltiercoolers/); pp. 1–9; 2000.
Tillman Steinbrecher; *The Heatsink Guide:Peltier coolers* (http://www.heatsink-guide.com/peltier.htm); pp. 1–5; Mar. 23, 2001.
Mr. Sengebusch; *Mirco peltier elements* (http://www.peltierelement.com/english/peltierelement/micro.html); pp. 1–3; Jul. 12, 2000.

* cited by examiner

*Primary Examiner*—Carl Whitehead, Jr.
*Assistant Examiner*—L. Cruz
(74) *Attorney, Agent, or Firm*—Timothy M. Honeycutt

(57) ABSTRACT

Various embodiments of a semiconductor-on-insulator substrate incorporating a Peltier effect heat transfer device and methods of fabricating the same are provided. In one aspect, a circuit device is provided that includes an insulating substrate, a semiconductor structure positioned on the insulating substrate and a Peltier effect heat transfer device coupled to the insulating substrate to transfer heat between the semiconductor structure and the insulating substrate.

25 Claims, 10 Drawing Sheets

INTEGRATED CIRCUIT COOLING DEVICE

BACKGROUND OF THE INVENTION

1. Field of the Invention

This invention relates generally to semiconductor processing, and more particularly to an integrated circuit incorporating Peltier heat transfer devices and to methods of making the same.

2. Description of the Related Art

Heat management plays a vital role in the process of designing most electrical devices. However, the microscopic geometries and tight electrical performance windows of integrated circuits present special challenges. Elevated chip operating temperatures impose constraints on the performance of the circuit in several ways. Chip operating temperature has a direct impact on the maximum available clocking speed and thus the overall speed performance of the integrated circuit. Furthermore, higher operating temperatures restrict the permissible operating voltage and ambient temperature environment of the chip. Lastly, chip life span is adversely impacted by higher operating temperatures. If the available mechanisms for integrated circuit heat dissipation cannot adequately handle the $I^2R$ heat propagation, compromises in the speed performance, the operating voltage, the applications and the design life span of the integrated circuit may have to be made.

In many conventional integrated circuit designs heat sinks with or without forced convection are used to provide macro scale cooling. A conductive heat transfer pathway is provided between the die and a heat sink that is coupled to the integrated circuit or to a package holding the integrated circuit. Many such conventional heat sinks consist of a plurality of metallic heat fins. The conduction heat flow from the die to the die package is limited by the thermal resistance of the heat flow pathway between the die and the package. The thermal resistance is a function of the thermal conductivities of the die and the package and the contact area between the two structures.

In some cases, there may be localized areas of high temperature or "hot spots" within an integrated circuit. If the semiconductor substrate on which the integrated circuit is formed has a relatively high coefficient of thermal conductivity, then conductive heat transfer from the hot spot into the bulk substrate may provide adequate temperature control, particularly if convection package cooling is applied. However, if the conductive heat transfer pathway away from the hot spot presents a high thermal resistance, then more localized thermal management may be indicated.

Silicon-on-insulator ("SOI") substrates represent examples of such high thermal resistance structures. In SOI substrates, junction isolation is provided by surrounding active device regions with an insulator. A typical SOI substrate includes a plurality of silicon islands formed on an insulating layer, usually of oxide. The silicon islands are also isolated laterally by an insulator, again usually an oxide. Thus, thermal conduction from the device regions must proceed through the surrounding oxide. Since oxide has a coefficient of thermal conductivity that is as much as factor of one hundred smaller than silicon, the thermal resistance for a silicon-to-oxide pathway is much larger than a similar pathway through silicon alone.

Integrated circuit fabrication on SOI substrates holds the promise of significant device scaling through increased packing density. However, without adequate localized heat management of such substrates, significant design hurdles may remain.

The present invention is directed to overcoming or reducing the effects of one or more of the foregoing disadvantages.

SUMMARY OF THE INVENTION

In accordance with one aspect of the present invention, a circuit device is provided that includes an insulating substrate, a semiconductor structure positioned on the insulating substrate and a Peltier effect heat transfer device coupled to the insulating substrate to transfer heat between the semiconductor structure and the insulating substrate.

In accordance with another aspect of the present invention, a circuit device is provided that includes a semiconductor substrate, an insulating substrate positioned on the semiconductor substrate and a semiconductor island positioned on the insulating substrate. A Peltier effect heat transfer device is positioned in the insulating substrate proximate the semiconductor island to transfer heat between the semiconductor island and the insulating substrate.

In accordance with another aspect of the present invention, an integrated circuit is provided that includes an insulating substrate and a semiconductor layer positioned on the insulating substrate. The semiconductor layer has a plurality of active semiconductor island regions. A plurality of circuit devices is positioned on the semiconductor layer. At least one Peltier effect heat transfer device is coupled to the insulating substrate to transfer heat between at least one of the active semiconductor island regions and the insulating substrate.

In accordance with another aspect of the present invention, a method of fabricating a circuit structure is provided that includes forming an insulating substrate, forming a Peltier effect heat transfer device in the insulating substrate and forming a semiconductor film on the insulating substrate proximate the Peltier effect heat transfer device.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
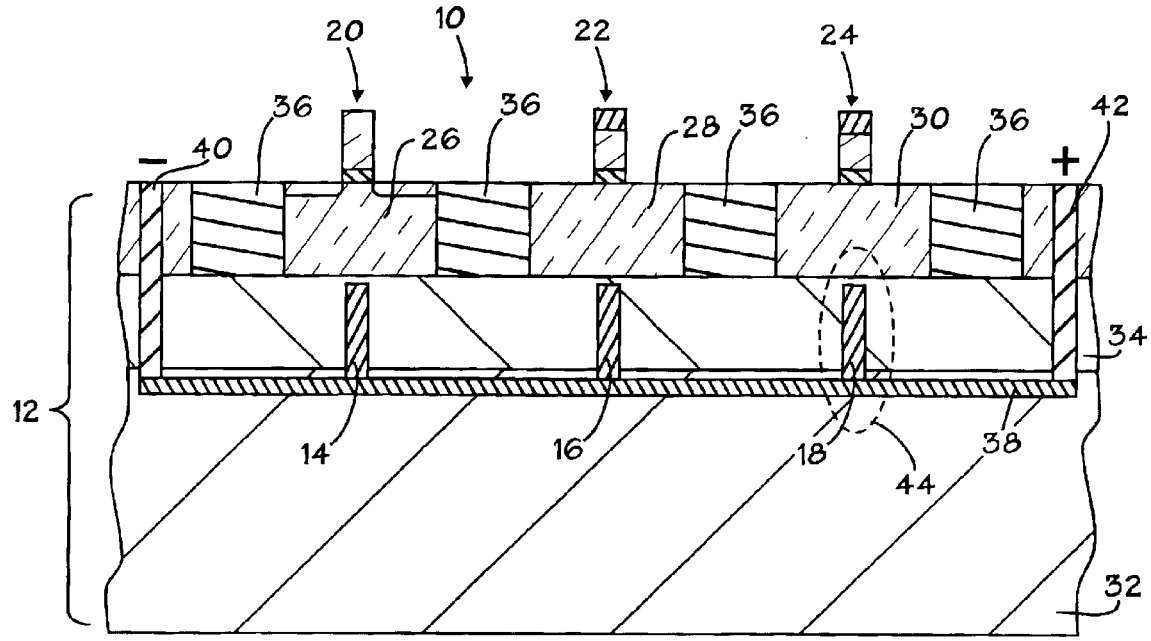
FIG. 1 is a cross-sectional view of an exemplary embodiment of an integrated circuit implemented on a semiconductor-on-insulator substrate in accordance with the present invention.

In the drawings described below, reference numerals are generally repeated where identical elements appear in more than one figure. FIG. 1 is a cross-sectional view of an exemplary embodiment of an integrated circuit 10 implemented on a semiconductor-on-insulator substrate 12. One or more circuit devices 14, 16 and 18 are provided in the semiconductor-on-insulator substrate 12 for the purpose of providing localized heat transfer between circuit elements 20, 22 and 24 and the substrate 12. The circuit devices 14, 16 and 18 are advantageously implemented as Peltier effect heat transfer devices. The circuit elements 20, 22 and 24 are implemented on respective active regions 26, 28 and 30 that are composed of a suitable semiconductor substrate material, such as, for example, silicon, germanium, or the like. In an exemplary embodiment, the active regions 26, 28 and 30 are composed of silicon. The circuit elements 20, 22 and 24 are depicted as a field effect transistor, and capacitors respectively. However, it should be understood that these particular circuit elements are merely illustrative of the myriad of different types of circuit elements that may be fashioned on the integrated circuit 10.

The insulator portion of the semiconductor-on-insulator substrate 12 consists of a base substrate 32, an insulator film or substrate 34 positioned on the base substrate 32 and an insulating film 36 positioned on the insulator substrate 34. The base substrate 32 may be an insulator or a semiconductor as desired. It is desirable for the base substrate 32 to have a relatively high thermal conductivity so that a favorable conductive heat transfer pathway is established between the Peltier effect heat transfer devices 14, 16 and 18 (hereinafter "Peltier devices") and the substrate 32. Thus, if silicon is selected, the base substrate 32 will have a thermal conductivity that is as much as a factor of one hundred or more larger than oxide. Furthermore, widely available silicon wafers may be used.

The insulator substrate 34 may be composed of well-known insulator materials, such as, for example, oxide, silicon nitride, sapphire, laminates of these or the like. The insulating film 36 may be composed of the same types of materials.

The insulator substrate 34 and the insulating film 36 subdivide the active regions 26, 28 and 30 into semiconductor islands. That is, the active regions 26, 28 and 30 are laterally and vertically electrically isolated by insulating material. An interconnect layer 38 is formed in the base substrate 32 to interconnect the Peltier devices 14, 16 and 18 to contact structures 40 and 42 which may be coupled to a voltage source as indicated by the plus and minus symbols.

Figure 2:
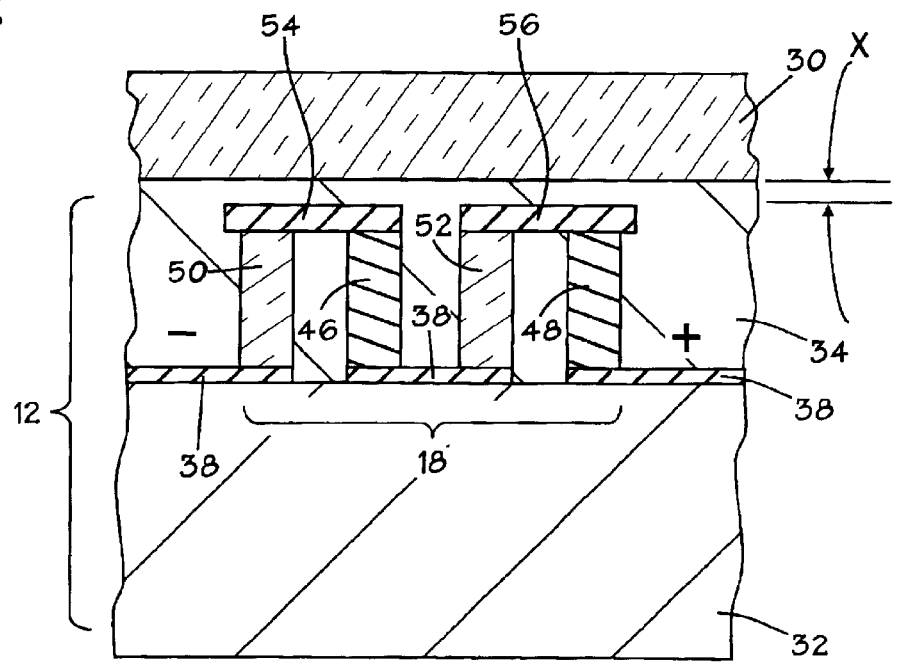
FIG. 2 is a magnified cross-sectional view of a selected portion of FIG. 1 in accordance with the present invention.

The dashed oval 44 in FIG. 1 represents an area that is illustrated in a magnified cross-sectional view in FIG. 2 to present a more detailed depiction of the Peltier heat transfer device 18. Referring now to FIG. 2, the Peltier device 18 consists of a plurality of p-n junctions. The p-n junctions are provided by series connected p-type impurity regions 46 and 48 connected in series to respective n-type impurity regions 50 and 52. The series connections between the respective impurity regions 48 and 52, and 46 and 50 are provided by a combination of the interconnect layer 38 and interconnect structures 54 and 56. Depending upon the polarity of the current passing through the Peltier device 18, the interconnect structures 54 and 56 may act as a cold plate or a hot plate, and the interconnect layer 38 may act as the opposite type of plate, i.e., a cold plate or a hot plate. If it is desired to transfer heat away from a given active region, such as the region 30 depicted in FIG. 2, then the polarity of the current flowing through the device 18 is set so that the top plate consisting of the interconnect structures 54 and 56 functions as a cold plate.

Note that the Peltier device 18 is formed in the insulator substrate 12 a distance X below the active region 30. It is desirable to make the gap X as small as possible so that heat transfer between the Peltier device 18 and the active region 30 is facilitated by a smaller heat transfer pathway. However, the gap X should be large enough to ensure that the operation of the Peltier device 18 does not interfere with the electrical function of any devices implemented on the active region 30.

The interconnect layer 38 may be composed of a variety of conductor materials, such as, for example, copper, gold, silver, tungsten, alloys of these, refractory metal silicides or the like. The interconnect structures 54 and 56 may be composed of the same types of materials. Materials with higher thermal conductivities will provide more favorable heat transfer between the active region 30 and the Peltier device 18.

The impurity regions 46, 48, 50 and 52 may be composed of semiconductor materials provided with a concentration level of impurities, e.g., p-type or n-type, as the case may be. Exemplary materials include, for example, silicon, germanium, gallium arsenide or the like. The impurities may be, for example, phosphorus, arsenic, boron, indium, antimony or $BF_2$.

Figure 3:
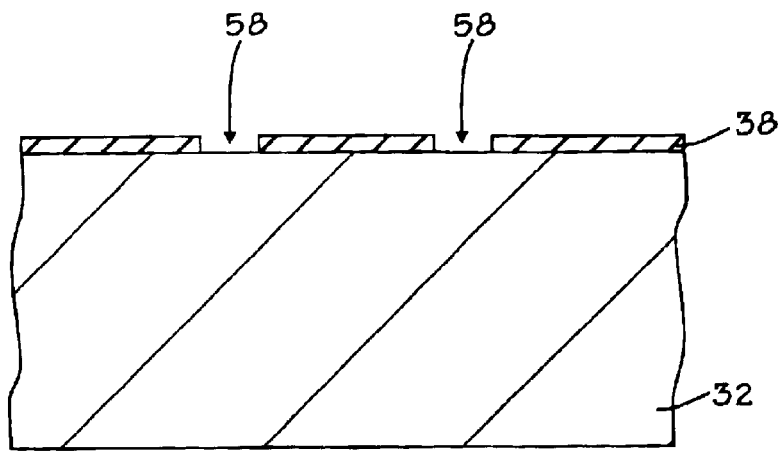
FIGS. 3–12 are cross-sectional views illustrating an exemplary method of fabricating the integrated circuit of FIG. 1 in accordance with the present invention.

An exemplary process flow for fabricating the Peltier device 18 in accordance with the present invention may be understood by referring now to FIGS. 3–12 and initially to FIG. 3. The following description will be applicable to the other Peltier devices 14 and 16 as well. Turning now to FIG. 3, the interconnect layer 38 may be fabricated on the base substrate 32 using well-known conductor deposition, lithography and etching techniques. The thickness of the interconnect layer 38 is largely a matter of design discretion. In an exemplary embodiment, gold is deposited by electrochemical plating to a thickness of about 1,500 to 4,000 Å. A suitable diffusion barrier and adhesion layer, such as Ti:W may be applied by CVD or physical vapor deposition prior to depositing the gold. The gold may then be masked with photoresist and dry etched using for example $Cl_2$ or $C_2Cl_2F_4$. Note that gaps 58 are provided between portions of the interconnect layer 38 to provide eventual spacing between adjacent impurity regions such as the regions 46 and 50 as depicted in FIG. 2.

Figure 4:
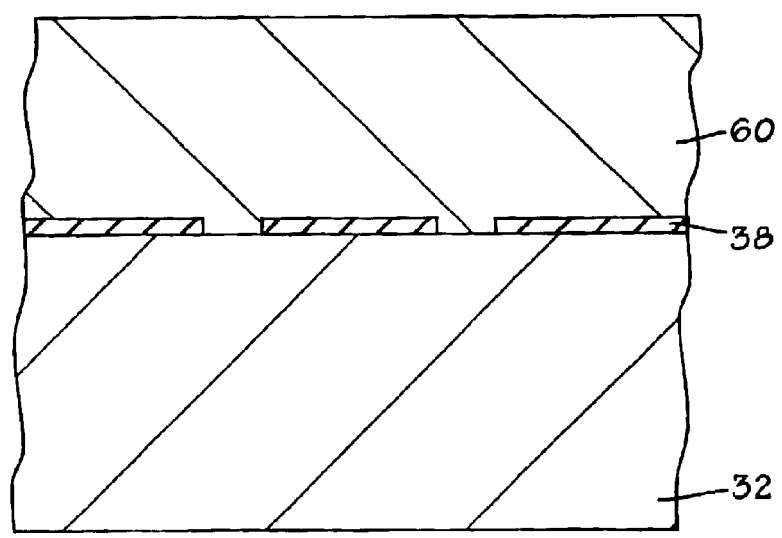

Referring now to FIG. 4, a layer 60 of semiconductor material is formed on the interconnect layer 38. Through subsequent masking, impurity introduction, and etching, the semiconductor layer 60 will be patterned into the impurity regions 46, 48, 50 and 52 depicted in FIG. 2. The semiconductor layer 60 is advantageously composed of a variety of well-known semiconductor materials, such as, for example, silicon or germanium. In an exemplary embodiment, silicon is deposited by epitaxial growth to a thickness of about 5,000 to 12,000 Å.

Figure 5:
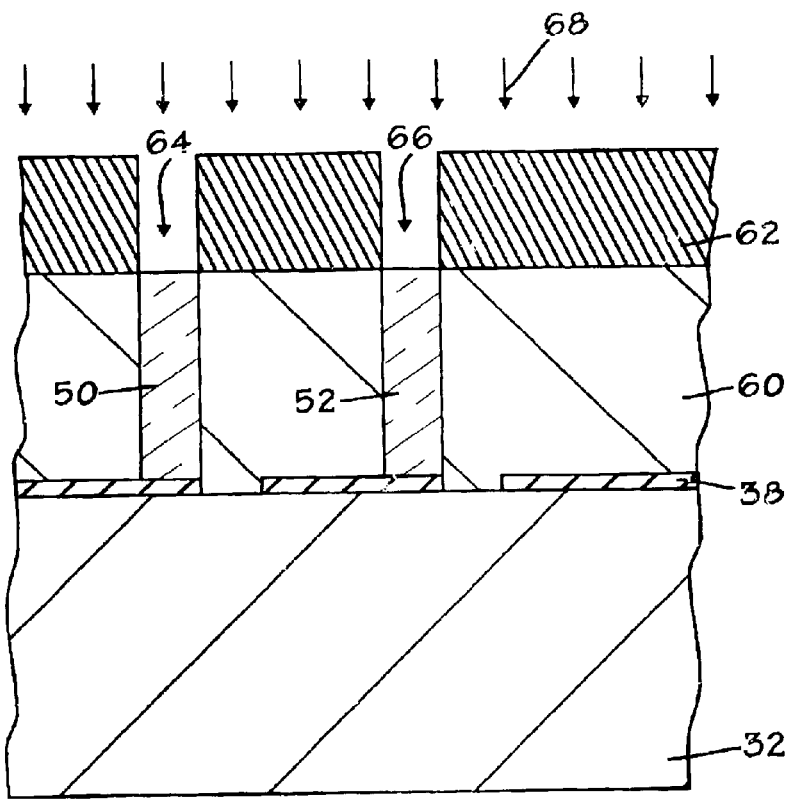

Referring now to FIG. 5, a photomask 62 is patterned on the semiconductor layer 60 using well-known photoresist deposition and lithography techniques. The mask 62 is patterned with openings 64 and 66 corresponding to the desired layouts for the impurity go regions 50 and 52. The impurity regions 50 and 52 are then established in the semiconductor layer 60 by introducing impurity ions 64 by implantation or diffusion as desired. In an exemplary embodiment, the impurity ions 68 are introduced by ion implantation. For example, if the impurity regions 50 and 52 will be p-type impurity regions, boron may be implanted at an energy of about 50 to 150 keV, a dosage of about 1E15 to 1E16 ions/cm$^{-2}$ and an implant angle of about 0°. A like dosage may be used if the impurity regions are 50 and 52 will be implemented as n-type regions with the energy tailored according to the atomic weight of the n-type impurity specie. Following the implant or diffusion step, the mask 62 may be stripped by ashing, solvent techniques, combinations of the two or the like.

Figure 6:
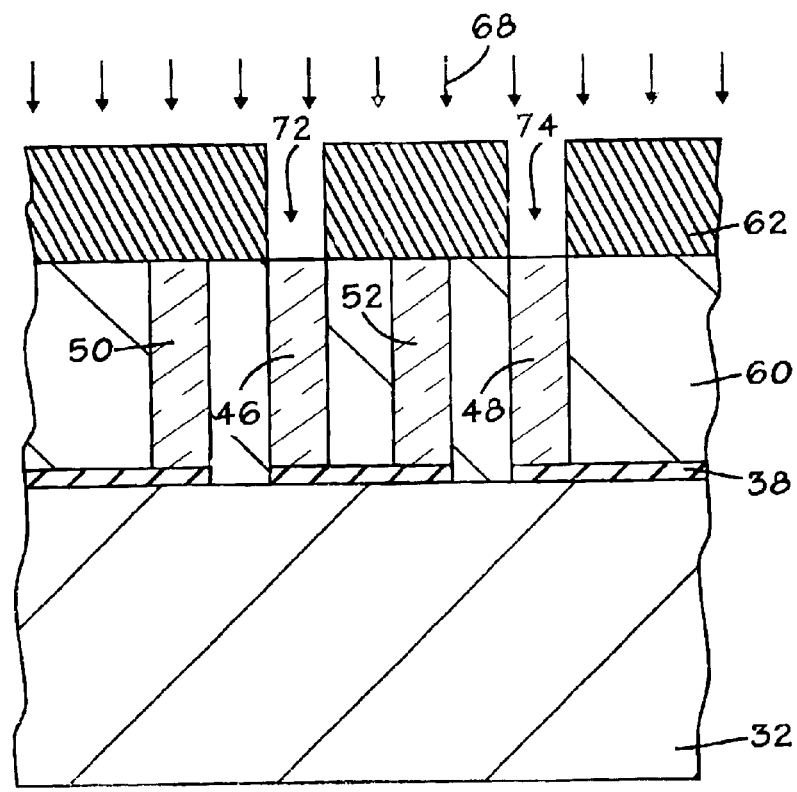

Referring now to FIG. 6, another photomask 70 is patterned on the semiconductor layer 60 with openings 72 and 74 corresponding to the desired layouts for the impurity regions 46 and 48. The impurity regions 46 and 48 may thereafter be established with a conductivity type opposite to the impurity regions 50 and 52 by introduction of impurity ions 68, again by ion implantation or diffusion as desired. For example, phosphorus may be implanted at an energy of 150 to 450 keV, a dosage of about 1E15 to 1E16 ions/cm$^{-2}$ and an implant angle of about 0°. Following the implant or diffusion step, the mask 70 may be stripped using the aforementioned techniques.

If ion implantation is used to establish impurity levels in the regions 46, 48, 50 and 52, then activation and repair of implant damage may be provided by performing an anneal at this stage. For example, a rapid thermal anneal may be performed at about 800 to 1100° C. for about 30 to 60 seconds. Optionally a furnace process may be used. However, subsequent high temperature steps associated with fabrication of the circuit devices 20, 22 and 24 (See FIG. 1) may be used for activation if desired.

Figure 7:
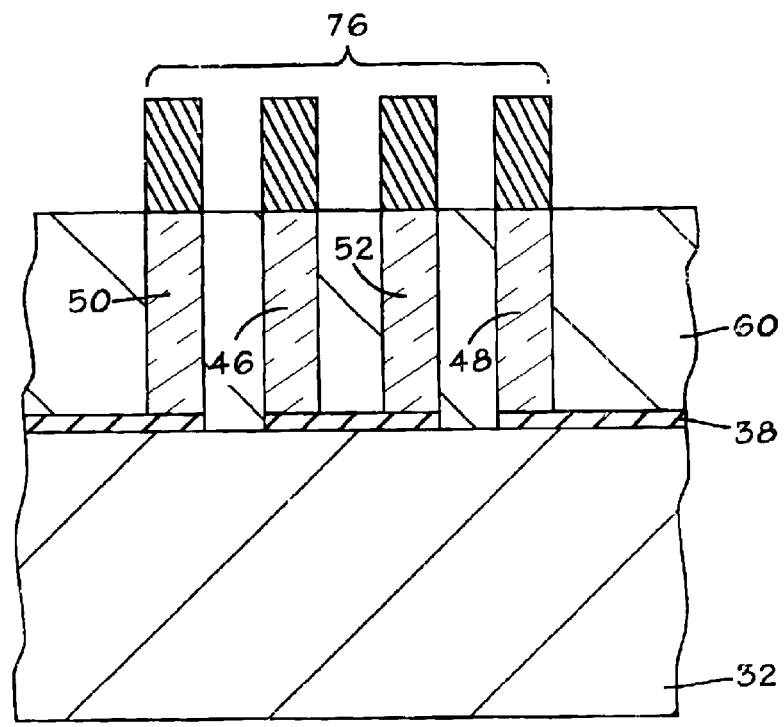

Referring now to FIG. 7, a photomask 76 is fabricated on the respective impurity regions 46, 48, 50 and 52 using well-known lithography techniques. The mask 76 is patterned with the same general layout as the impurity regions 46, 48, 50 and 52 and will serve as an etch mask.

Figure 8:
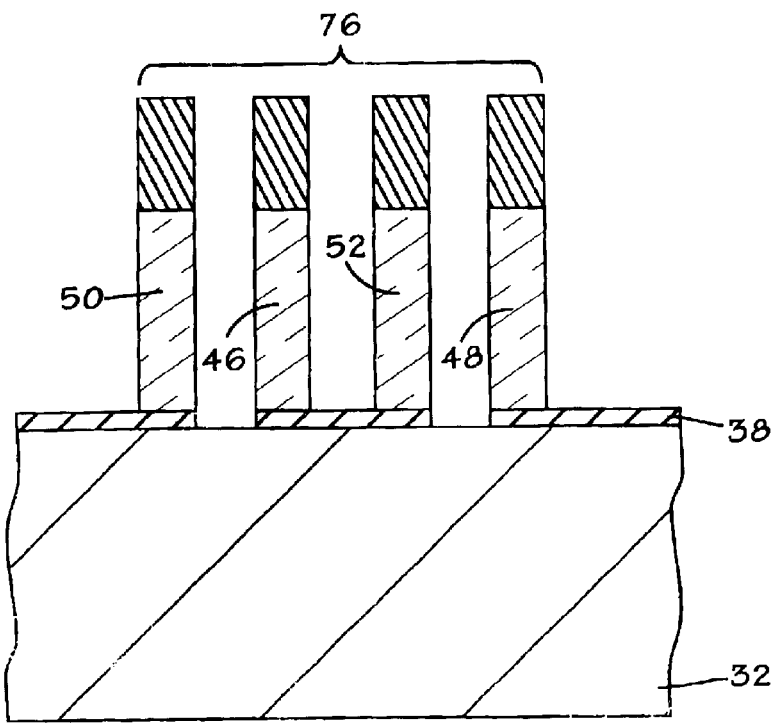

Referring now to FIG. 8, the semiconductor layer 60 is directionally etched to remove all but the impurity regions 46, 48, 50 and 52. A variety of well-known directional etching techniques, such as, for example, reactive ion etching, chemical plasma etching, or other suitable anisotropic etching techniques may be used in conjunction with chemistries suitable for directionally etching silicon, such as $CF_4$. Following the etch, the photomask 76 may be stripped using the aforementioned techniques.

Figure 9:
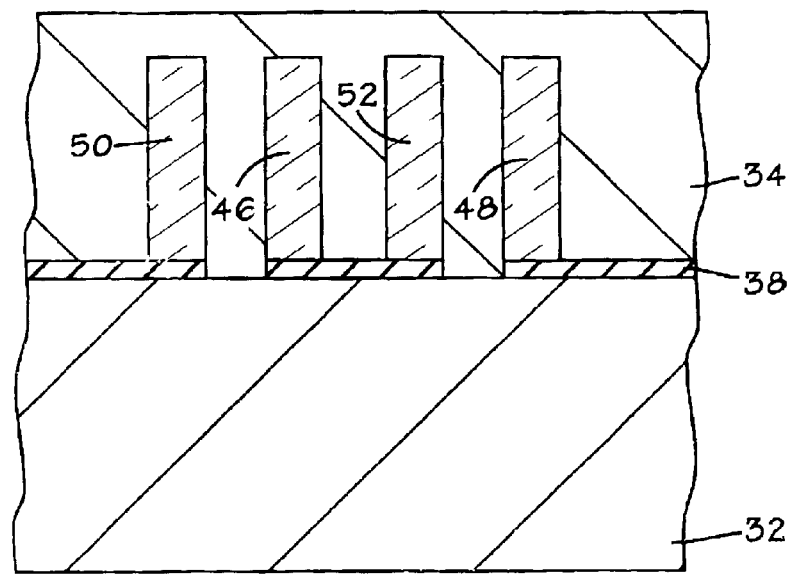

Referring now to FIG. 9, the insulator layer 34 is formed over the impurity regions 46, 48, 50 and 52 to establish lateral electrical isolation between the adjacent impurity regions 46, 48, 50 and 52. A variety of well-known insulator materials may be used such as, for example, tetra-ethyl-ortho-silicate ("TEOS"), silane-based oxide, doped glasses or the like. In an exemplary embodiment, TEOS is deposited by CVD to a depth of about 6,000 to 14,000 Å such that the film 34 completely covers the impurity regions 46, 48, 50 and 52 as shown.

Figure 10:
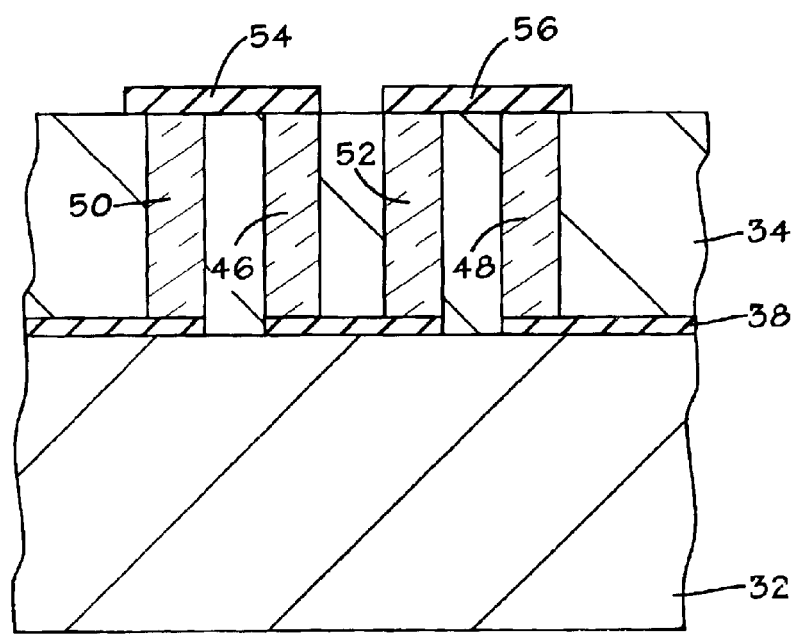

As shown in FIG. 10, the insulator film 34 is planarized back substantially to the tops of the impurity regions 46, 48, 50 and 52 by CMP, etchback planarization or the like. The interconnect structures 54 and 56 are next formed on the impurity regions 46, 48, 50 and 52. The interconnect structures 54 and 56 may be fabricated from the same types of materials and using the same types of well-known lithography and directional etching techniques used to establish the interconnect layer 38.

Figure 11:
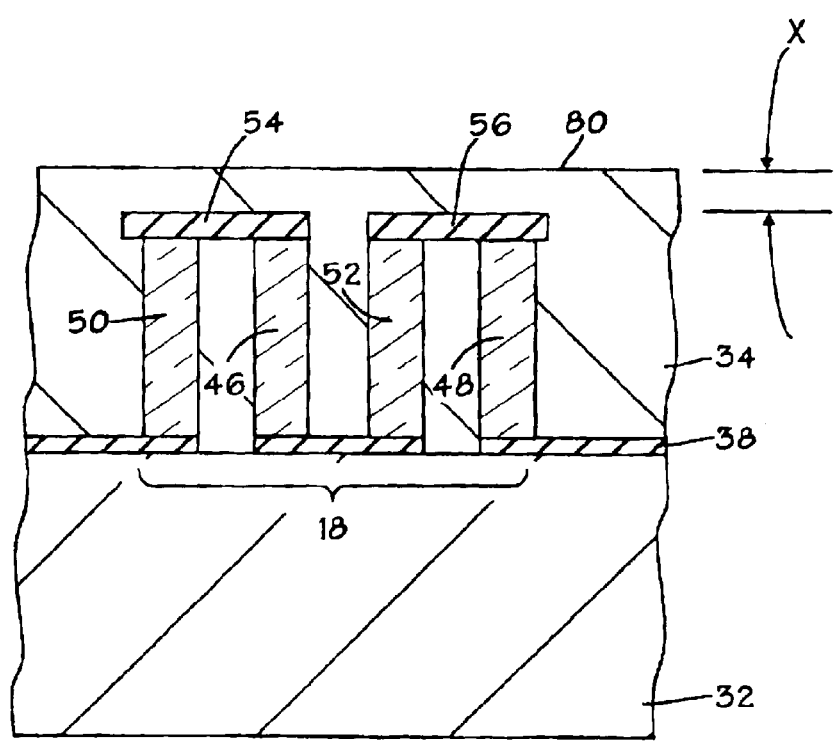

Referring now to FIG. 11, the thickness of the insulator film 34 is increased to establish the desired gap X between the interconnect structures 54 and 56 and the upper surface 80 of the film 34. This thickening may be accomplished by a thermal oxidation or CVD as desired. In an exemplary embodiment, TEOS is deposited by CVD to establish the requisite thickness X.

Figure 12:
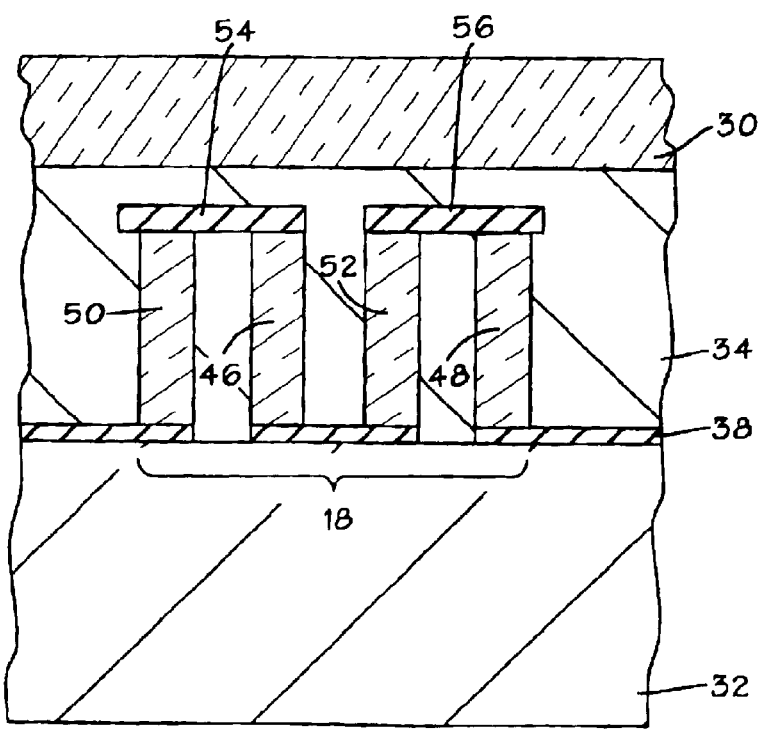

Referring now to FIGS. 1 and 12, the semiconductor island or active region 30 as well as the active regions 26 and 28 may be established on the insulator film 34 using a variety of different techniques. For example, the active regions 26, 28 and 30 may be initially deposited as a unitary epitaxial silicon layer that is thereafter suitably masked and directionally etched to yield the defined islands, 26, 28 and 30. Thereafter, a bulk deposition of insulator may be provided to establish the insulator film 36 that can then be planarized back to define the individual islands 26, 28 and 30. Optionally, a reverse process may be used, that is, the insulator film 36 fabrication may precede the deposition and planarization of a semiconductor film from which the islands 26, 28 and 30 may be defined. In still another option, a bulk semiconductor film may be deposited and thereafter suitably masked and an oxygen implant may be performed into the layer to define pockets of oxide that comprise the insulator film 36. These techniques represent just a few possible methods of establishing the semiconductor-on-insulator character of the islands 26, 28 and 30.

Still referring to FIG. 1, the contact structures 40 and 42 may be established using well-known trench etching and conductor fill techniques. For example, reactive ion etching, chemical plasma etching, or other suitable anisotropic etching techniques may be used in conjunction a chemistry suitable for the etched films. The structures 40 and 42 may be composed of tungsten, titanium, tungsten nitride, tantalum, aluminum, copper or the like. An adhesion layer of Ti:W, TiN or Ti:TiN may be deposited if desired. The structures 40 and 42 may be planarized as shown using CMP, etchback planarization or the like.

The substrate 12 may undergo further processing to establish the various circuit devices 20, 22 and 24 of the integrated circuit 10 using well-known fabrication processes and materials.

Figure 13:
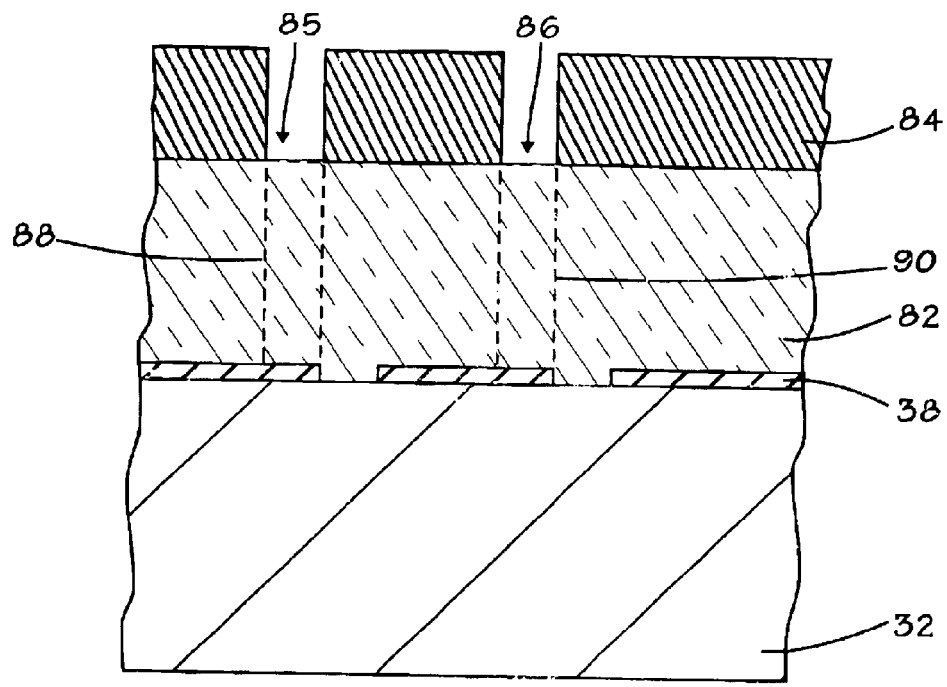
FIGS. 13–19 are cross-sectional views illustrating an alternate exemplary method of fabricating an integrated circuit in accordance with the present invention.

An alternate exemplary process flow for fabricating the Peltier devices 14, 16 and 18 in accordance with the present invention may be understood by referring now to FIGS. 13–18 and initially to FIG. 13. Again, the description will be in the context of the Peltier device 18, but will be illustrative of the other devices 14 and 16 as well. Turning now to FIG. 13, fabrication of the interconnect layer 38 may be substantially as described above. Thereafter, an insulating film 82 is formed over the interconnect layer 38. A variety of well-known insulator materials may be used such as, for example, TEOS, silane-based oxide, doped glasses or the like. In an exemplary embodiment, TEOS is desposited by CVD to a depth of about 6000 to 14,000 Å and within that thickness range such that the film 34 completely covers the impurity regions 46, 48, 50 and 52 as shown. A suitable etch mask 84 composed of photoresist is next patterned on the insulator film 82 with openings 85 and 86 corresponding to the desired layouts for the impurity regions 50 and 52 as represented by the dashed boxes 88 and 90.

Figure 14:
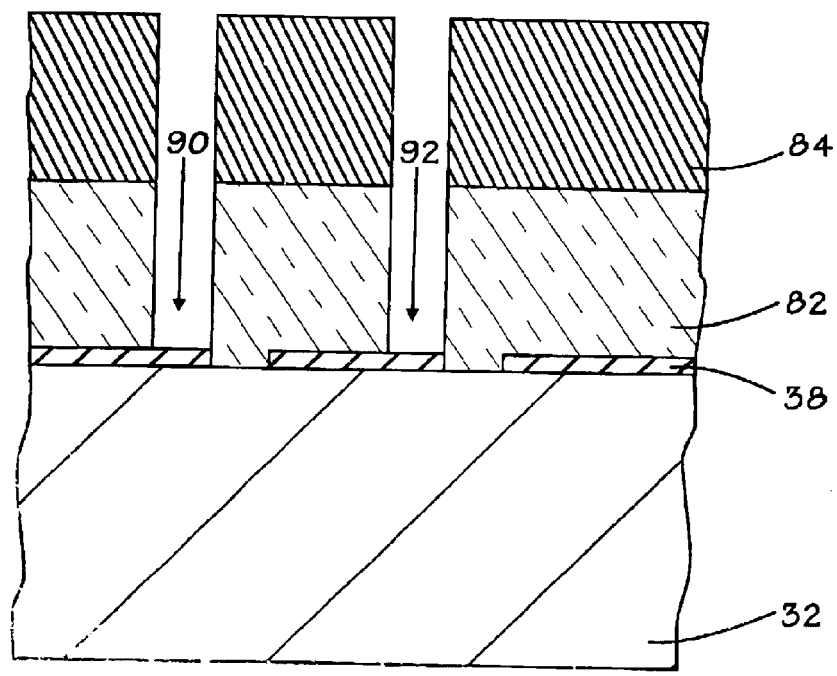

Referring now to FIG. 14, the unmasked portions 88 and 90 of the layer 82 shown in FIG. 13 are directionally etched to yield trenches 92 and 94. Reactive ion etching, chemical plasma etching, or other suitable anisotropic etching techniques may be used in conjunction a chemistry suitable for the film 82. The mask 84 may then be stripped by ashing, solvent stripping or the two in concert.

Figure 15:
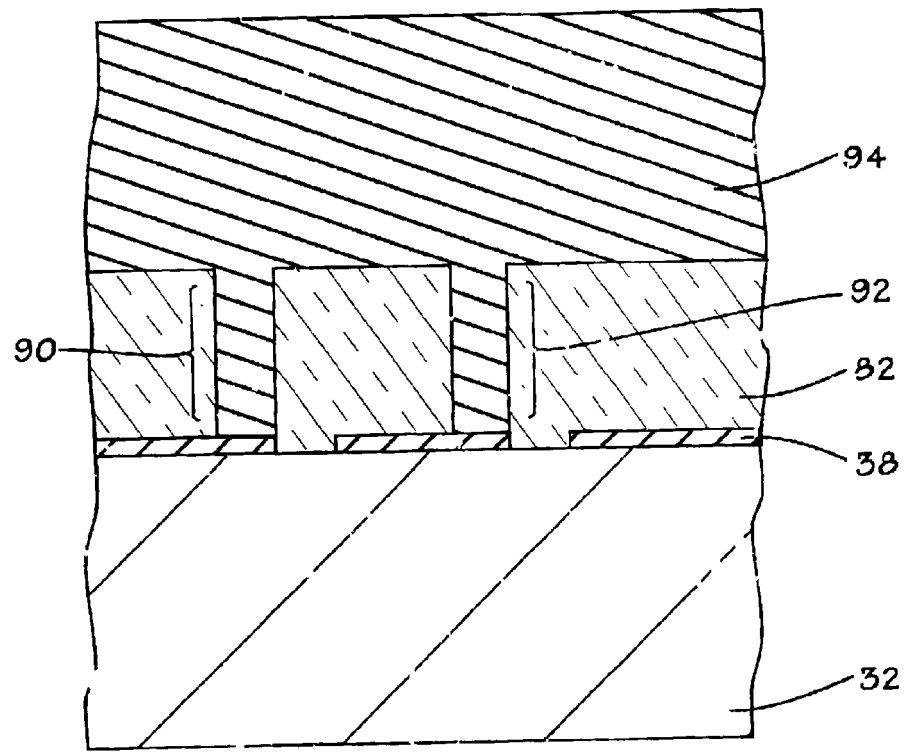
Figure 16:
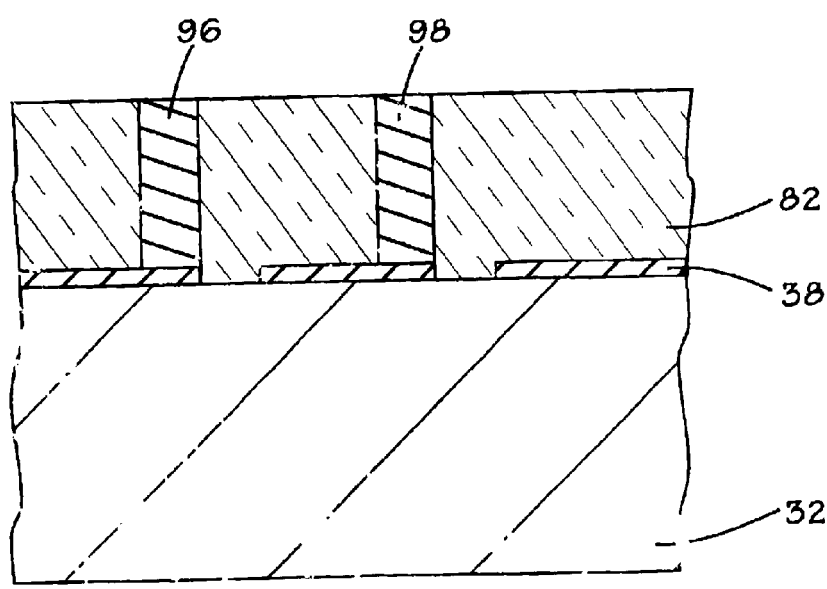

Referring now to FIG. 15, an in-situ doped epitaxial semiconductor film 94 is deposited over the insulating film 82 filling the trenches 90 and 92. The film 94 may be composed of silicon, germanium or the like. Following the epitaxial deposition, a planarization step is performed by CMP, etchback planarization or the like as shown in FIG. 16 to leave in-situ doped semiconductor plugs 96 and 98 in ohmic contact with portions of the interconnect layer 38. The plugs 96 and 98 may be p-type doped or n-type doped as the case may be depending on the conductivity type of the in-situ doping used for the epitaxial layer 94.

Figure 17:
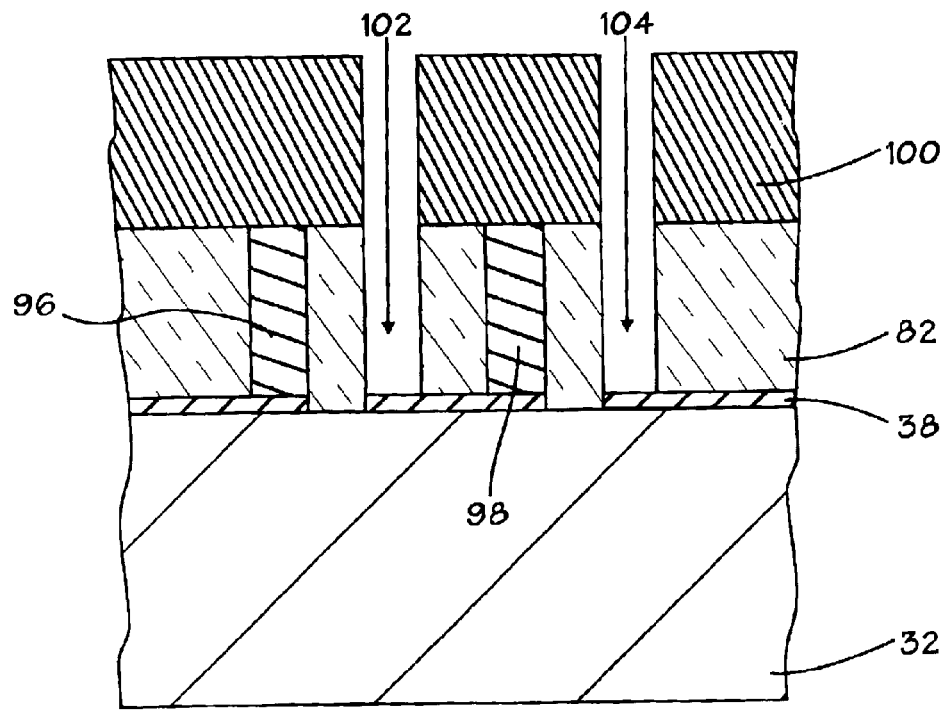

Referring now to FIG. 17, the process is reversed, that is, a photomask 100 is patterned over the insulating film 82 and a directional etch is performed to establish trenches 102 and 104, using the same techniques described in conjunction with FIG. 14. Thereafter, the photomask 100 may be stripped by ashing, solvent stripping or the two in concert.

Figure 18:
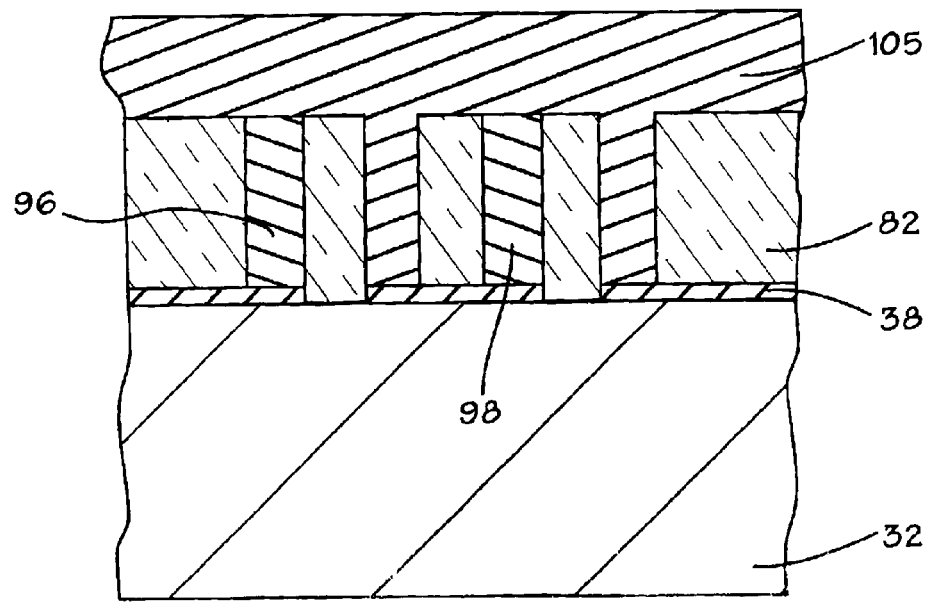

As shown in FIG. 18, an epitaxial semiconductor layer 105 is deposited to fill the trenches 102 and 104 with a semiconductor. Like the steps used to form the plugs 96 and 98, the deposition process may incorporate in-situ doping so that the subsequently defined plugs in the trenches 106 and 108 will possess sufficient conductivity rendering impurities.

Figure 19:
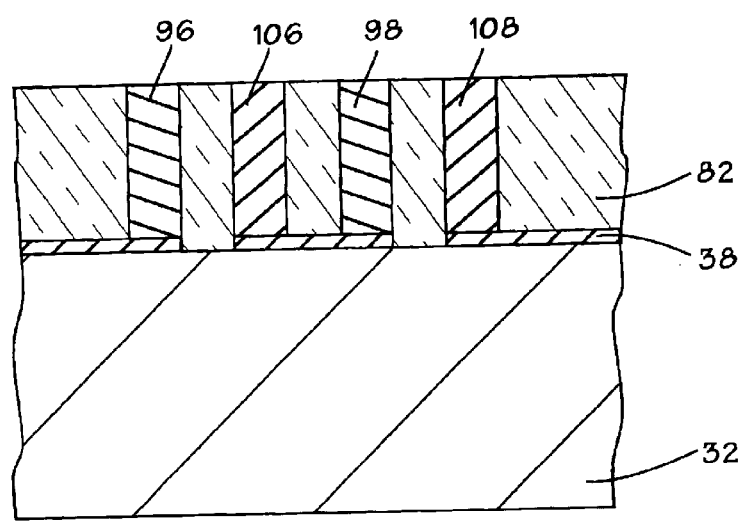

Referring now to FIG. 19, a planarization step is performed to planarize the epi-silicon film 105 shown in FIG. 18 down to the insulating film 82 to leave the fully defined semiconductor plugs 106 and 108. At this stage, processing may continue as generally described above and depicted in FIGS. 10–12 to complete the interconnects between the various semiconductor impurity regions 96, 98, 106 and 108 to yield a completed Peltier device 18 as shown in FIG. 12.

Figure 20:
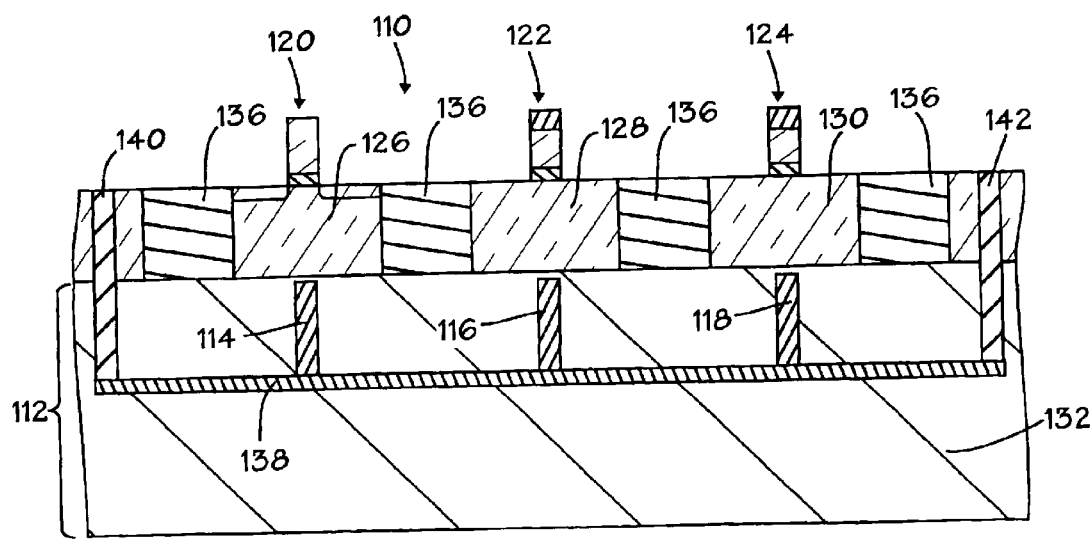
FIG. 20 is a cross-sectional view like FIG. 1 depicting an alternate exemplary embodiment of an integrated circuit implemented on a semiconductor-on-insulator substrate in accordance with the present invention.

In the embodiment illustrated in FIG. 1, the integrated circuit 10 and the various Peltier devices 14, 16 and 18 are implemented on a semiconductor-on-insulator substrate 12 that includes a base substrate, an intermediary insulating film 34, and a top insulating film 36 that defines a plurality of semiconductor islands. In the alternate embodiment depicted in FIG. 20, an integrated circuit 110 may be implemented on a semiconductor-on-insulator substrate 112 that consists of a base insulating substrate 132 and an overlying insulating layer 136 that is interspersed with a plurality of semiconductor islands 126, 128 and 130. As with the embodiment disclosed in FIG. 1, the Peltier devices 114, 116 and 118 are positioned in the insulating substrate 112, and in particular within the insulating base substrate 134 beneath respective of the active regions 126, 128 and 130. In this way, heat transfer between the substrate 112 and the various circuit devices 120, 122 and 124 may be provided as described above. Again, the Peltier devices 114, 116 and 118 may be interconnected via the interconnect layer 138 and contact structures 140 and 142.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A circuit device comprising:
   an insulating substrate;
   a semiconductor structure positioned on the insulating substrate; and
   a Peltier effect heat transfer device positioned in the insulating substrate and not in the semiconductor structure to transfer heat between the semiconductor structure and the insulating substrate.

2. The circuit device of claim 1, wherein the semiconductor structure comprises an island surrounded by an insulating material.

3. The circuit device of claim 2, wherein the insulating material comprises part of the insulating substrate.

4. The circuit device of claim 2, wherein the insulating material comprises an insulating film positioned on the insulating substrate.

5. The circuit device of claim 4, wherein the Peltier effect heat transfer device is positioned in the insulating film.

6. The circuit device of claim 1, wherein the insulating substrate comprises oxide.

7. The circuit device of claim 1, wherein the semiconductor structure comprises silicon.

8. The circuit device of claim 1, comprising a semiconductor substrate positioned below the insulating substrate.

9. The circuit device of claim 1, wherein the Peltier heat transfer device comprises a plurality of pn junctions connected in series.

10. A circuit device, comprising:
    a semiconductor substrate;
    an insulating substrate positioned on the semiconductor substrate;
    a semiconductor island positioned on the insulating substrate; and
    a Peltier effect heat transfer device positioned in the insulating substrate proximate but not in the semiconductor island to transfer heat between the semiconductor island and the insulating substrate.

11. The circuit device of claim 10, wherein the semiconductor island is surrounded by an insulating material.

12. The circuit device of claim 11, wherein the insulating material comprises part of the insulating substrate.

13. The circuit device of claim 11, wherein the insulating material comprises an insulating film positioned on the insulating substrate.

14. The circuit device of claim 10, wherein the insulating substrate comprises oxide.

15. The circuit device of claim 10, wherein the semiconductor island comprises silicon.

16. The circuit device of claim 10, wherein the Peltier heat transfer device comprises a plurality of pn junctions connected in series.

17. An integrated circuit, comprising:
    an insulating substrate;
    a semiconductor layer positioned on the insulating substrate and having a plurality of active semiconductor island regions;
    a plurality of circuit devices positioned on the semiconductor layer, and
    at least one Peltier effect heat transfer device coupled to the insulating substrate to transfer heat between at least one of the active semiconductor island regions and the insulating substrate.

18. The circuit device of claim 17, wherein the plurality of semiconductor island regions is surrounded by an insulating material.

19. The circuit device of claim 18, wherein the insulating material comprises part of the insulating substrate.

20. The circuit device of claim 18, wherein the insulating material comprises an insulating film positioned on the insulating substrate.

21. The circuit device of claim 17, wherein the insulating substrate comprises oxide.

22. The circuit device of claim 17, wherein the plurality of semiconductor island regions comprises silicon.

23. The circuit device of claim 17, comprising a semiconductor substrate positioned below the insulating substrate 24. The circuit device of claim 23, wherein the at least one Peltier effect heat transfer device is positioned partially in the insulating substrate and partially in the semiconductor substrate.

25. The circuit device of claim 17, wherein the at least one Peltier heat transfer device comprises a plurality of pn junctions connected in series.

* * * * *